US008526184B2

(12) United States Patent  (10) Patent No.: US 8,526,184 B2
Sullivan et al.  (45) Date of Patent: Sep. 3, 2013

(54) DEVICES HAVING A THERMAL INTERFACE AND METHODS OF FORMING THE SAME

(75) Inventors: Robert C. Sullivan, Stow, MA (US); Michael R. Palis, Lancaster, MA (US); Ryan Pellecchia, Leominister, MA (US)

(73) Assignee: Curtiss-Wright Controls, Inc., Charlotte, NC (US)

( * ) Notice: Subject to any disclaimer, the term of this patent is extended or adjusted under 35 U.S.C. 154(b) by 293 days.

(21) Appl. No.: 12/556,293

(22) Filed: Sep. 9, 2009

(65) Prior Publication Data

US 2011/0058335 A1  Mar. 10, 2011

(51) Int. Cl.
*H05K 7/20* (2006.01)
(52) U.S. Cl.
USPC .......... 361/704; 361/719; 361/721; 165/80.2
(58) Field of Classification Search
USPC .......... 361/704, 719, 721; 165/80.2; 411/79; 211/41; 403/409.1
See application file for complete search history.

(56) References Cited

U.S. PATENT DOCUMENTS

| | | | | |
|---|---|---|---|---|
| 3,767,058 A | * | 10/1973 | Barlow et al. | 211/41.17 |
| 3,971,186 A | * | 7/1976 | Havelka et al. | 403/374.4 |
| 3,975,805 A | * | 8/1976 | Spurling et al. | 403/374.3 |
| 4,318,157 A | * | 3/1982 | Rank et al. | 361/704 |
| 4,354,770 A | * | 10/1982 | Block | 403/409.1 |
| 4,480,287 A | * | 10/1984 | Jensen | 361/707 |
| 4,751,963 A | * | 6/1988 | Bui et al. | 165/80.2 |
| 4,775,260 A | * | 10/1988 | Kecmer | 403/409.1 |
| 4,819,713 A | * | 4/1989 | Weisman | 165/80.2 |
| 4,824,303 A | * | 4/1989 | Dinger | 411/79 |
| 4,879,634 A | * | 11/1989 | Storrow et al. | 361/708 |
| 4,994,937 A | * | 2/1991 | Morrison | 361/715 |
| 5,010,444 A | * | 4/1991 | Storrow et al. | 361/719 |
| 5,036,428 A | * | 7/1991 | Brownhill et al. | 361/721 |
| 5,071,013 A | * | 12/1991 | Peterson | 211/26 |
| 5,090,840 A | * | 2/1992 | Cosenza | 403/409.1 |
| 5,156,647 A | * | 10/1992 | Ries | 411/75 |
| 5,225,964 A | * | 7/1993 | Nemes | 361/719 |
| 5,253,963 A | * | 10/1993 | Ries | 411/75 |
| 5,290,122 A | * | 3/1994 | Hulme | 403/374.4 |
| 5,414,592 A | * | 5/1995 | Stout et al. | 361/704 |
| 5,472,353 A | * | 12/1995 | Hristake et al. | 439/327 |
| 5,607,273 A | * | 3/1997 | Kecmer et al. | 411/79 |
| 5,779,388 A | * | 7/1998 | Yamamoto | 403/374.1 |
| 5,827,585 A | * | 10/1998 | Giannetti | 428/362 |
| 5,954,122 A | * | 9/1999 | Sittig | 165/80.2 |
| 6,054,198 A | | 4/2000 | Bunyan et al. | |

(Continued)

FOREIGN PATENT DOCUMENTS

| | | |
|---|---|---|
| JP | 9201993 | 8/1997 |
| JP | 10198462 | 7/1998 |
| KR | 19970046104 | 7/1997 |
| KR | 20090065930 | 6/2009 |

OTHER PUBLICATIONS

International Search Report issued in related International Application No. PCT/US2010/047984, May 2011.

*Primary Examiner* — Anatoly Vortman
(74) *Attorney, Agent, or Firm* — Onello & Mello, LLP

(57) ABSTRACT

A conduction-cooled enclosure comprises a card guide having a card guide channel, at least one controlled-volume cavity in the card guide channel, and a thermal interface material (TIM) in the at least one controlled-volume cavity.

34 Claims, 11 Drawing Sheets

(56) References Cited

U.S. PATENT DOCUMENTS

| | | | |
|---|---|---|---|
| 6,151,215 A * | 11/2000 | Hoffman | 361/704 |
| 6,246,582 B1 | 6/2001 | Habing et al. | |
| 6,249,936 B1 * | 6/2001 | Webster | 24/569 |
| 6,278,609 B1 | 8/2001 | Suzuki et al. | |
| 6,285,564 B1 * | 9/2001 | O'Brien | 361/801 |
| 6,839,235 B2 * | 1/2005 | St. Louis et al. | 361/700 |
| 6,873,528 B2 * | 3/2005 | Hulan et al. | 361/719 |
| 7,031,167 B1 * | 4/2006 | Zagoory et al. | 361/759 |
| 7,483,271 B2 * | 1/2009 | Miller et al. | 361/704 |
| 2002/0080577 A1 | 6/2002 | Babcock et al. | |
| 2003/0142477 A1 | 7/2003 | Elias et al. | |
| 2003/0223197 A1 * | 12/2003 | Hulan et al. | 361/719 |
| 2004/0017656 A1 | 1/2004 | Lee et al. | |
| 2004/0037045 A1 * | 2/2004 | Phillips et al. | 361/719 |
| 2004/0042178 A1 | 3/2004 | Gektin et al. | |
| 2006/0133033 A1 | 6/2006 | Straub, Jr. et al. | |
| 2007/0177367 A1 | 8/2007 | Bailey et al. | |
| 2007/0211442 A1 * | 9/2007 | Miller et al. | 361/752 |
| 2009/0154180 A1 | 6/2009 | Cho et al. | |
| 2010/0226106 A1 * | 9/2010 | Suarez et al. | 361/759 |

* cited by examiner

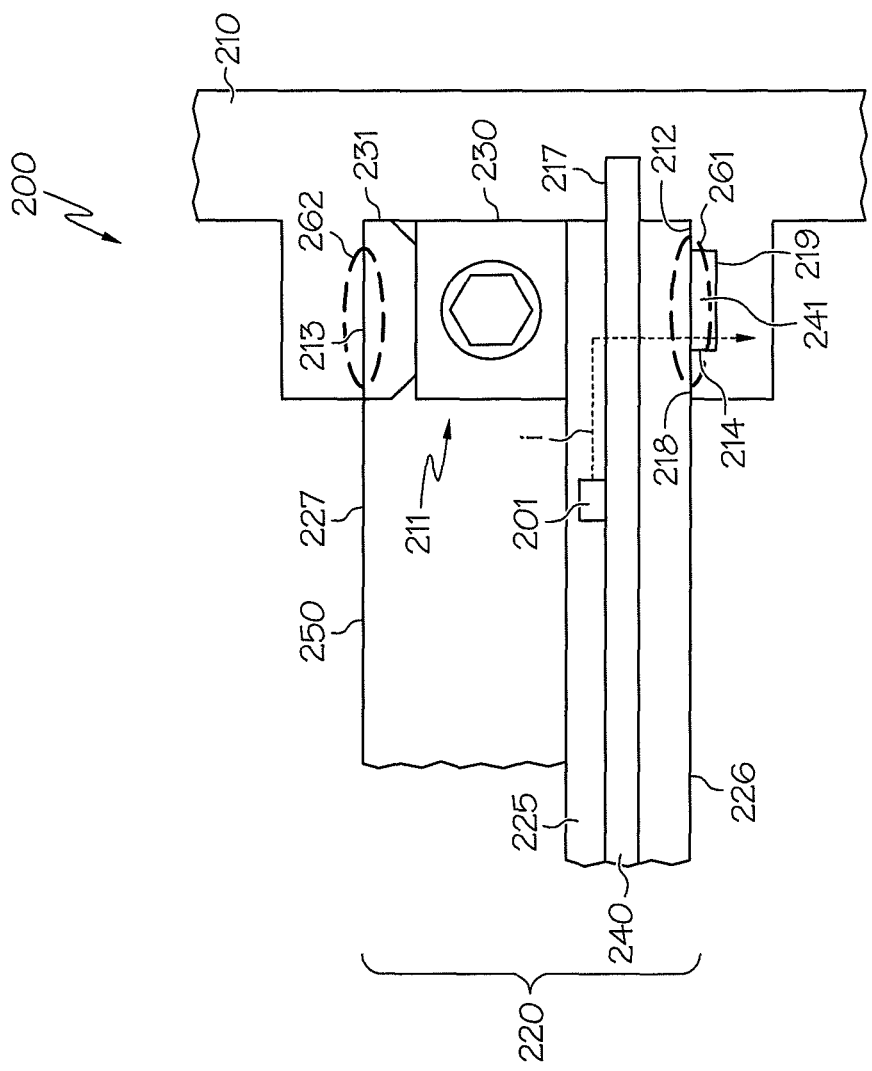
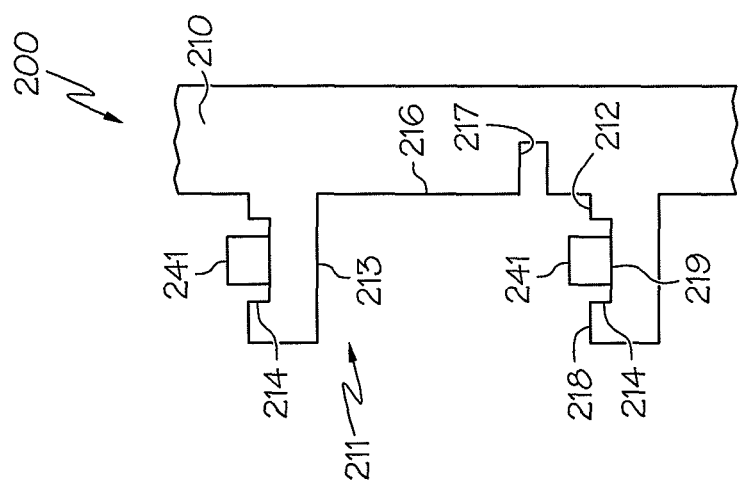
FIG. 4B
FIG. 4A

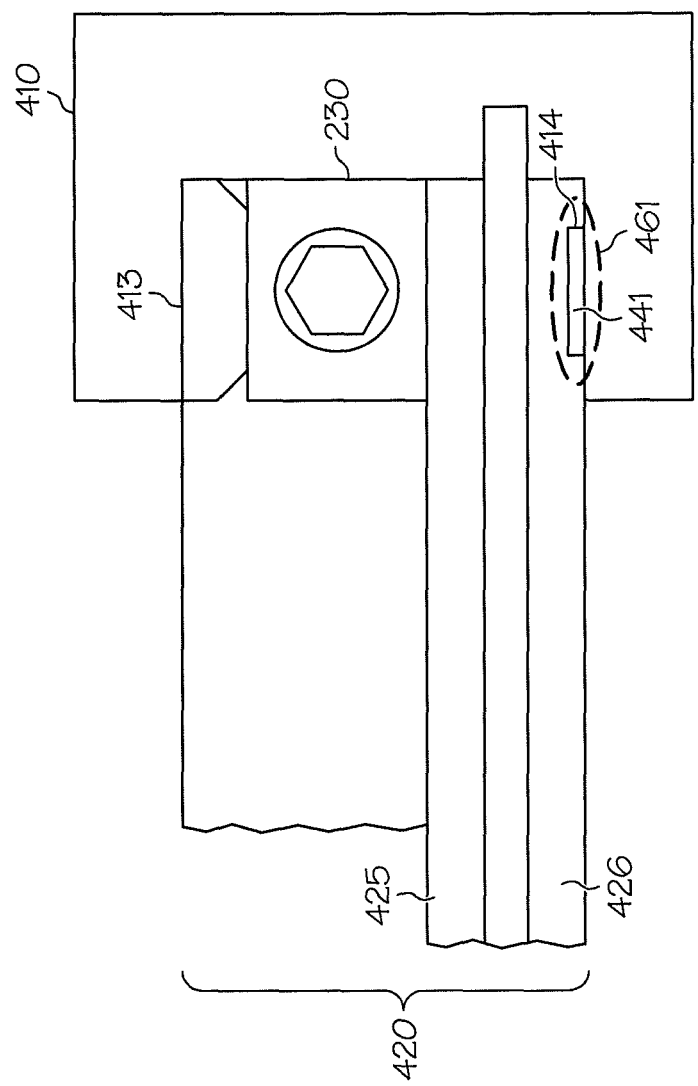

DEVICES HAVING A THERMAL INTERFACE AND METHODS OF FORMING THE SAME

BACKGROUND

Circuit cards, for example, conduction-cooled circuit card assemblies (CCAs) complying with international standards such as IEEE Std. 1101.2-1992, ANSI-VITA 30.1 and VITA 48.2, can be mounted in an enclosure such as a card cage, chassis, rack, package or case, and can also be easily removed from the enclosure for replacement or repair.

A typical card cage enclosure includes a plurality of card slots, each card slot defined by a pair of card guides positioned along first and second opposed sides of a card cage, for example, at a top and bottom of the card cage, or at a left side and right side of the card cage. This configuration permits the circuit card to be properly seated in the card cage to ensure electrical and thermal registration of the circuit card in the card cage.

During operation, electronic components on the circuit card can generate a significant amount of thermal energy that causes the temperature inside the card cage to increase, in particular, in configurations where a plurality of circuit cards densely populates the card cage. However, an excessive increase in temperature in the card cage can result in damage to circuit cards residing in the card cage, or more specifically, to electronic components on the circuit cards.

According to some conventional approaches, the temperature inside the card cage can be reduced by natural convection, for example, using exterior fins or slots in the card cage to remove heat from the card cage to an ambient environment, and to draw cooler air into the card cage.

In other approaches, the temperature can be reduced by forced convection, for example, using fans, or using pipes carrying cooling liquids through channels integrated into the walls of the card cage.

In other approaches, heat generated by electronic components on a circuit card can be at least partially removed by conductive cooling, i.e., dissipation or removal of heat from the circuit card to the surrounding card cage chassis via a conduction frame, which conducts heat away from the electronic components on the circuit card to the card cage chassis, for transfer to the ambient environment.

FIG. 1 is an illustrative view of a conventional arrangement of a CCA module 120 mounted or inserted in a conduction-cooled card cage 110. FIG. 2A is a front view of the conventional arrangement of the CCA module 120 mounted in the conduction-cooled card cage 110 of FIG. 1, illustrating a dry-contact interface A between the CCA module 120 and the card cage 110. FIG. 2B is a graph illustrating a typical temperature profile across the dry-contact interface A illustrated in FIGS. 1 and 2A.

The CCA module 120 includes a conduction frame 150 that is secured to a card guide 111 integrated into a sidewall of the card cage 110 by two wedge clamps 130, also referred to as wedge locks.

The conduction frame 150 includes a conduction plate 151 coupled to the bottom surface of a substrate 140 of the CCA module 120. The conduction plate 151 is thermally coupled to electronic components 121 that populate a top surface of the substrate 140 by a plurality of thermally conductive vias 153 that are formed through the substrate 140.

Accordingly, heat that is generated by the electronic components 121 on the CCA module 120 can be removed by one or more conduction paths formed between the electronic component 121 and the card cage 110. In particular, a first conduction flow path, indicated by a dotted line (i) in FIG. 2A, can be formed between electronic component 121, through a thermally conductive via 153 in the conduction frame 140, and a first thermal interface A, referred to as a "dry-contact interface," or bare junction thermal interface, between the conduction plate 151 and the card guide 111. Although a dry-contact interface can refer to one metal surface that is directly on another metal surface, such as a metal-to-metal interface, a dry-contact interface can also include intervening elements, such as gaskets, adhesives, etc. positioned between the two surfaces.

The thermal resistance at thermal interface A depends largely in part on the amount of force exerted by the wedge clamps 130 against the surface of the card guide 111. A greater force applied by the wedge clamp 130 against the upper surface of the card guide 111 can decrease the thermal resistance at thermal interface A, resulting in improved heat flow along the conduction flow path, but such contact force alone is limited in its ability to reduce the thermal resistance. On the other hand, a lesser force applied by the wedge clamp 130 to the upper surface of the card guide 111 can lead to an undesirable higher thermal resistance at thermal interface A.

In high-power conduction-cooled applications, a high thermal resistance at thermal interface A can lead to significant thermal performance problems. For example, a typical thermal interface exhibiting a thermal resistance of 0.2° C./watt to 0.4° C./watt, and a 150 Watt CCA with heat flux equally distributed on two thermal interfaces, also referred to as wedge clamp interfaces, can experience a 15° C. to 30° C. temperature rise across each wedge clamp interface, i.e., location "A" in FIGS. 2A and 2B. As shown in FIG. 2B, this can result in the edge of CCA module 120 and card cage 110 having a substantial temperature difference ΔT, for example, the edge of the CCA module 120 having a temperature that is 15° C. to 30° C. higher than the surface of the card cage 110. This can result in the CCA module 120 being unusable in many applications because the CCA module 120 can overheat in a typical high temperature ambient environment of 70° C. without sufficient cooling.

In addition to the abovementioned first conduction flow path, a second conduction flow path, shown by dashed line (ii) in FIG. 2A, can be formed between electronic component 121 and thermal interface B between wedge clamp 130 and card guide 111. This second conduction flow path (ii) is not as effective for removing heat as the abovementioned first conduction flow path (i), since the main body of the wedge clamp 130 is not in good thermal contact with the top portion 131 of the wedge clamp 130, which can exhibit high thermal resistance when the top portion 131 of the wedge clamp 130 is separated from the main body of the wedge clamp 130 when the wedge clamp 130 is expanded to hold the CCA module 120 firmly in place against the card guide 111, and since the thermal interface B between the top portion 131 and the top surface of the card guide 111 can also exhibit a high thermal resistance.

SUMMARY OF INVENTION

Embodiments of the present invention relate to thermal interfaces that optimize the conductive cooling of electronic components on a circuit card seated in a card slot of an enclosure.

In accordance with one aspect, provided is a conduction-cooled enclosure comprising: a card guide having a card guide channel; at least one controlled-volume cavity in the card guide channel; and a thermal interface material (TIM) in the at least one controlled-volume cavity.

In an embodiment, the card guide includes a compression stop that controls the amount of compression of the TIM in the cavity.

In an embodiment, the controlled-volume cavity extends along a majority of a length of the card guide channel, the controlled-volume cavity in at least one of a top surface of the card guide channel and a bottom surface of the card guide channel.

In an embodiment, the controlled-volume cavity comprises a plurality of cavities in at least one of a top surface of the card guide channel and a bottom surface of the card guide channel, and wherein the TIM comprises a plurality of TIMs, each positioned in one of the plurality of cavities.

In an embodiment, when a circuit card assembly is removably secured to the card guide, a first conduction cooling path is formed from the circuit card assembly to the enclosure through the TIM.

In an embodiment, a second conduction cooling path is formed from the circuit card assembly through a dry-contact interface between the card guide channel and the circuit card assembly.

In an embodiment, a first controlled-volume cavity is positioned in a bottom surface of the card guide channel and a second controlled-volume cavity is positioned in a top surface of the card guide channel, and wherein a first TIM is positioned in the first controlled-volume cavity and a second TIM is positioned in the second controlled-volume cavity.

In an embodiment, when a circuit card assembly is removably secured to the card guide, a first conduction cooling path is formed from the circuit card assembly to the enclosure through the first TIM and a second conduction cooling path is formed from the circuit card assembly to the enclosure through the second TIM.

In an embodiment, a third conduction cooling path is formed from the circuit card assembly through a dry-contact interface between the top surface of the card guide channel and the circuit card assembly and a fourth conduction cooling path is formed from the circuit card assembly to the enclosure through a dry-contact interface between the bottom surface of the card guide channel and the circuit card assembly.

In an embodiment, the enclosure further comprises a circuit card assembly in thermal contact with at least one of a top surface and a bottom surface of the card guide channel, wherein the circuit card assembly comprises electronic components, and wherein the circuit card assembly is in thermal contact with the at least one of the top surface and the bottom surface of the card guide channel via a dry-contact interface between the circuit card assembly and the at least one of the top surface and the bottom surface of the card guide channel.

In an embodiment, a conduction cooling path is provided from the electronic components of the circuit card assembly to the enclosure through the TIM and through the dry-contact interface.

In an embodiment, the circuit card assembly is a conduction-cooled circuit card assembly (CCA).

In an embodiment, the circuit card assembly comprises a conduction frame proximal to an edge of the circuit card assembly, the conduction frame in thermal communication with the electronic components.

In an embodiment, the TIM is compressed in the at least one controlled-volume cavity between the conduction frame and the card guide, such that the conduction frame is in thermal contact with the card guide and the TIM.

In an embodiment, the circuit card assembly comprises a retaining device that secures the circuit card assembly in place against the card guide. In an embodiment, the retaining device comprises a wedge clamp. In an embodiment, the retaining device applies a force against the circuit card assembly to compress the TIM in the controlled-volume cavity until the edge of the circuit card assembly is in thermal contact with the card guide and the TIM.

In an embodiment, the TIM is compressed in the controlled-volume cavity between the circuit card assembly and the card guide, such that the circuit card assembly is in thermal contact with the at least one of the top and bottom surfaces of the card guide and the TIM.

In an embodiment, the circuit card assembly includes a controlled-volume cavity. In an embodiment, a TIM is positioned in the controlled-volume cavity of the circuit card assembly. In an embodiment, a conduction cooling path is provided from the electronic components of the circuit card assembly to the enclosure through the TIM and the dry-contact interface.

In accordance with another aspect, provided is a card guide of a conduction-cooled enclosure constructed and arranged to accept an edge of a circuit card, wherein a dry-contact interface is between the card guide and the circuit card, the card guide including: a card guide channel having a top surface, a bottom surface, and a sidewall between the top surface and the bottom surface; a controlled-volume cavity in at least one of the top surface of the card guide channel and the bottom surface of the card guide channel; and a thermal interface material (TIM) in the controlled-volume cavity, wherein when the circuit card is mounted in the card guide, the circuit card is in thermal contact with the at least one of the top surface and the bottom surface of the card guide channel such that a conduction cooling path is formed from the circuit card to the enclosure through the TIM.

In an embodiment, the conduction cooling path is formed through the dry-contact interface.

In an embodiment, a first card guide is positioned at a first side of the enclosure and accepts a first edge of the circuit card, and wherein a second card guide is positioned at a second side of the enclosure opposite the first side and accepts a second edge of the circuit card opposite the first edge.

In an embodiment, the circuit card is a conduction-cooled circuit card assembly (CCA).

In an embodiment, the circuit card comprises a conduction frame proximal to the edge of the circuit card, and wherein the TIM is compressed in the controlled-volume cavity between the conduction frame and the card guide, such that the conduction frame is in thermal contact with the card guide and the TIM.

In an embodiment, the circuit card comprises a wedge clamp that secures the circuit card in place against the card guide.

In an embodiment, the wedge clamp applies a force against the circuit card to compress the TIM in the controlled-volume cavity until the edge of the circuit card is in thermal contact with the card guide and the TIM.

In an embodiment, the TIM is compressed in the controlled-volume cavity between the circuit card and the card guide, such that the circuit card is in thermal contact with the at least one of the top and bottom surfaces of the card guide and the TIM.

In an embodiment, the card guide includes a compression stop that controls the amount of compression of the TIM in the cavity.

In an embodiment, the controlled-volume cavity comprises a plurality of cavities in at least one of the top surface of the card guide channel and the bottom surface of the card guide channel, and wherein the TIM comprises a plurality of TIMs, each positioned in one of the plurality of cavities.

In an embodiment, a first controlled-volume cavity is positioned in the bottom surface of the card guide channel and a second controlled-volume cavity is positioned in the top surface of the card guide channel, and wherein a first TIM is in the first controlled-volume cavity and a second TIM is in the second controlled-volume cavity.

In an embodiment, when the circuit card is removably secured to the edge of the card guide, a first conduction cooling path is formed from the circuit card to the enclosure through the first TIM and a second conduction cooling path is formed from the circuit card to the enclosure through the second TIM.

In an embodiment, a third conduction cooling path is formed from the circuit card through a dry-contact interface between the top surface of the card guide channel and the circuit card and a fourth conduction cooling path is formed from the circuit card to the enclosure through a dry-contact interface between the bottom surface of the card guide channel and the circuit card.

In accordance with another aspect, provided is a circuit card constructed and arranged to be inserted in a card cage, the circuit card comprising: at least one controlled-volume cavity proximal to an edge of the circuit card; and a thermal interface material (TIM) in the at least one controlled-volume cavity.

In an embodiment, the circuit card is a conduction-cooled circuit card assembly (CCA).

In an embodiment, the circuit card comprises a conduction frame proximal to the edge of the circuit card. In an embodiment, the at least one controlled-volume cavity is positioned in the conduction frame.

In an embodiment, the TIM is compressed in the at least one controlled-volume cavity between the circuit card and the card cage, such that circuit card is in thermal contact with the card cage.

In an embodiment, the circuit card comprises a retaining device that secures the circuit card in place against the card cage. In an embodiment, the retaining device comprises a wedge clamp. In an embodiment, the retaining device applies a force against the circuit card to compress the TIM in the controlled-volume cavity until the edge of the circuit card is in thermal contact with the card cage and the TIM. In an embodiment, the at least one controlled-volume cavity is positioned in the retaining device.

In an embodiment, a conduction cooling path is provided from electronic components of the circuit card to the card cage through the TIM.

In accordance with another aspect, provided is a method of forming a conduction-cooled enclosure comprising: forming a card guide channel in a card guide; forming at least one controlled-volume cavity in the card guide channel; and positioning a thermal interface material (TIM) in the at least one controlled-volume cavity.

In an embodiment, the card guide includes a compression stop that controls the amount of compression of the TIM in the cavity.

In an embodiment, the controlled-volume cavity extends along a majority of a length of the card guide channel, the controlled-volume cavity in at least one of a top surface of the card guide channel and a bottom surface of the card guide channel.

In an embodiment, the controlled-volume cavity comprises a plurality of cavities in at least one of a top surface of the card guide channel and a bottom surface of the card guide channel, and wherein the TIM comprises a plurality of TIMs, each positioned in one of the plurality of cavities.

In an embodiment, a first controlled-volume cavity is positioned in a bottom surface of the card guide channel and a second controlled-volume cavity is positioned in a top surface of the card guide channel, and wherein a first TIM is positioned in the first controlled-volume cavity and a second TIM is positioned in the second controlled-volume cavity.

In an embodiment, a first controlled-volume cavity is positioned in a bottom surface of the card guide channel and a second controlled-volume cavity is positioned in a top surface of the card guide channel, and wherein a first TIM is positioned in the first controlled-volume cavity and a second TIM is positioned in the second controlled-volume cavity.

In an embodiment, when a circuit card assembly is removably secured to the card guide, a first conduction cooling path is formed from the circuit card assembly to the enclosure through the first TIM and a second conduction cooling path is formed from the circuit card assembly to the enclosure through the second TIM.

In an embodiment, a third conduction cooling path is formed from the circuit card assembly through a dry-contact interface between the top surface of the card guide channel and the circuit card assembly and a fourth conduction cooling path is formed from the circuit card assembly to the enclosure through a dry-contact interface between the bottom surface of the card guide channel and the circuit card assembly.

In an embodiment, the method comprises inserting a circuit card assembly into the enclosure, such that the circuit card assembly is in thermal contact with at least one of a top surface and a bottom surface of the card guide channel, wherein the circuit card assembly comprises electronic components, and wherein the circuit card assembly is in thermal contact with the at least one of the top surface and the bottom surface of the card guide channel via a dry-contact interface between the circuit card assembly and the at least one of the top surface and the bottom surface of the card guide channel.

In an embodiment, a conduction cooling path is provided from the electronic components of the circuit card assembly to the enclosure through the TIM and through the dry-contact interface.

In an embodiment, the circuit card assembly is a conduction-cooled circuit card assembly (CCA).

In an embodiment, the circuit card assembly comprises a retaining device that secures the circuit card assembly in place against the card guide. In an embodiment, the retaining device comprises a wedge clamp. In an embodiment, the retaining device applies a force against the circuit card assembly to compress the TIM in the controlled-volume cavity until the edge of the circuit card assembly is in thermal contact with the card guide and the TIM.

In an embodiment, the TIM is compressed in the controlled-volume cavity between the circuit card assembly and the card guide, such that the circuit card assembly is in thermal contact with the at least one of the top and bottom surfaces of the card guide and the TIM.

In accordance with another aspect, provided is a method of cooling an enclosure into which a circuit card is removably secured, the method comprising: forming a controlled-volume cavity in at least one of an inner surface of the enclosure and an edge of the circuit card; inserting a thermal interface material (TIM) in the controlled-volume cavity; and securing the circuit card to the enclosure, wherein a conduction cooling path is formed from the circuit card to the enclosure through the TIM.

In an embodiment, the controlled-volume cavity extends along a majority of a length of the card guide channel, the controlled-volume cavity in at least one of a top surface of the card guide channel and a bottom surface of the card guide channel.

In an embodiment the controlled-volume cavity comprises a plurality of cavities in at least one of a top surface of the card guide channel and a bottom surface of the card guide channel, and wherein the TIM comprises a plurality of TIMs, each positioned in one of the plurality of cavities.

In an embodiment, when a circuit card assembly is removably secured to the card guide, a first conduction cooling path is formed from the circuit card assembly to the enclosure through the TIM.

In an embodiment a second conduction cooling path is formed from the circuit card assembly through a dry-contact interface between the card guide channel and the circuit card assembly.

In an embodiment, a first controlled-volume cavity is positioned in a bottom surface of the card guide channel and a second controlled-volume cavity is positioned in a top surface of the card guide channel, and wherein a first TIM is positioned in the first controlled-volume cavity and a second TIM is positioned in the second controlled-volume cavity.

In an embodiment, when a circuit card assembly is removably secured to the card guide, a first conduction cooling path is formed from the circuit card assembly to the enclosure through the first TIM and a second conduction cooling path is formed from the circuit card assembly to the enclosure through the second TIM.

In an embodiment, a third conduction cooling path is formed from the circuit card assembly through a dry-contact interface between the top surface of the card guide channel and the circuit card assembly and a fourth conduction cooling path is formed from the circuit card assembly to the enclosure through a dry-contact interface between the bottom surface of the card guide channel and the circuit card assembly.

BRIEF DESCRIPTION OF THE DRAWINGS

The above and other aspects and advantages will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of embodiments of the invention. In the drawings:

FIG. 4A is a cross-sectional front view of one portion of the card guide of FIGS. 3A and 3B, including a thermal interface material (TIM) inserted into a controlled-volume cavity of the conduction-cooled card cage, in accordance with aspects of the present invention;

FIG. 4B is an expanded cross-sectional front view of the conduction-cooled card cage shown in FIGS. 3A, 3B, and 4A populated with a circuit card assembly that is secured to the conduction-cooled card cage by a wedge clamp, in accordance with aspects of the present invention;

FIG. 6 is a front view of an embodiment wherein a thermal interface material (TIM) 441 is inserted into a controlled-volume cavity formed directly in an outer surface of a conduction plate, in accordance with aspects of the present invention;

DETAILED DESCRIPTION OF EMBODIMENTS

Figure 1:
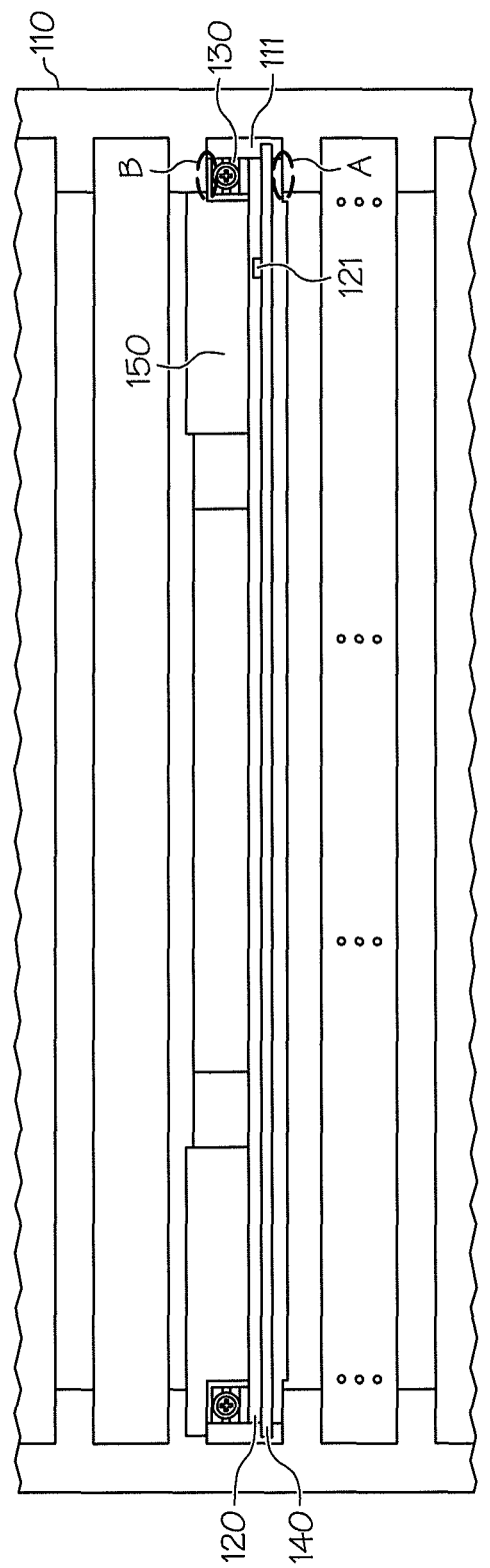
FIG. 1 is an illustrative front view of a conventional arrangement of a circuit card mounted or inserted in a conduction-cooled card cage.

The accompanying drawings are described below, in which example embodiments in accordance with the present invention are shown. Specific structural and functional details disclosed herein are merely representative. This invention may be embodied in many alternate forms and should not be construed as limited to example embodiments set forth herein.

Accordingly, specific embodiments are shown by way of example in the drawings. It should be understood, however, that there is no intent to limit the invention to the particular forms disclosed, but on the contrary, the invention is to cover all modifications, equivalents, and alternatives falling within the spirit and scope of the claims.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on," "connected to" "abutting," "coupled to," or "extending from" another element, it can be directly on, connected to, abutting, or coupled to the other element or intervening elements may be present. In contrast, when an element is referred to as being "directly on," "directly connected to," "directly abutting," "directly coupled to," or "directly extending from" another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

In order to overcome the limitations described above with regard to conventional approaches to reducing temperature in a card cage, a low thermal resistance at an interface between a circuit card and the card cage is desirable. Thermal interface materials (TIMs) are commonly inserted between a semiconductor device package and a conduction frame or heat sink to improve the thermal resistance therebetween. However, proper application of a TIM requires controlled compression. Otherwise, the TIM can be damaged by over-compression, or produce undesirable foreign object debris in the card cage, which can damage the electronic components of the circuit card assembly.

Further, when a TIM is compressed between two conductive surfaces, for example, between an electronic component and a heat sink, the TIM can contain gels, waxes, pastes, or liquids that flow into the interface between the electronic component and heat sink to improve thermal contact. Therefore, a TIM used in this manner is not reusable. If the electronic component is separated from the heat sink, for example, to replace or repair the electronic component, a new TIM must be reapplied when the electronic component and heat sink are reconnected.

Further, TIMs, for example, Indium strips used as TIMs, are often used in configurations that do not require a frequent separation of the two elements between which the TIM is fixedly and permanently sandwiched, for example, fixed between an electronic component and a heat sink. However, such configurations are not conducive to motion that occurs in the shear plane of the TIM, and are not conductive to re-use. For example, an Indium strip used as a TIM can generate foreign object debris when such motion occurs, and is therefore not reusable.

Figure 2A:
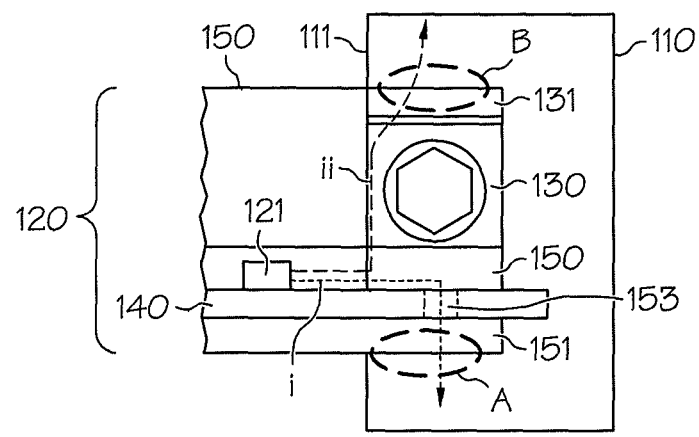
FIG. 2A is a front view of the conventional arrangement of the circuit card mounted in the conduction-cooled card cage of FIG. 1, illustrating a dry-contact interface between the circuit card and the card cage.
Figure 2B:
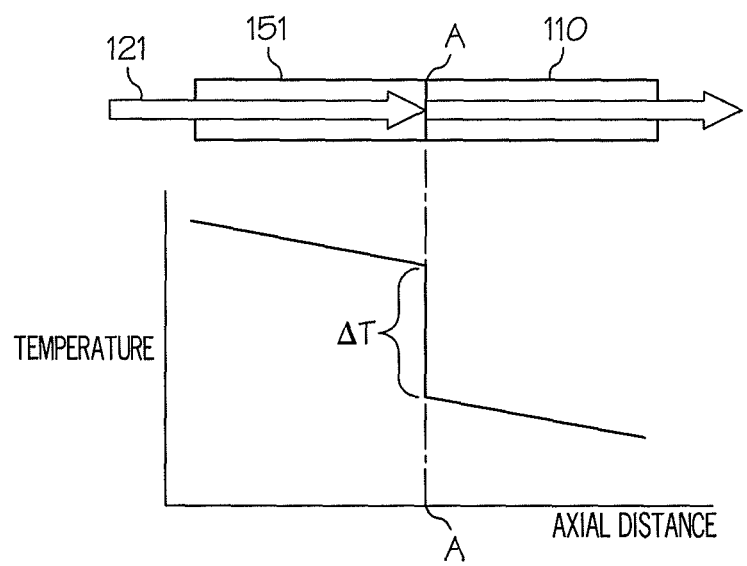
FIG. 2B is a graph illustrating a typical temperature profile across the dry-contact interface illustrated in FIGS. 1 and 2A.

Further, TIMs generally include elastic properties, so they are not suitable for applications requiring rigid structural properties at this interface, for example, properties that address and overcome environmental factors, such as high levels of shock and vibration that may be placed upon an enclosure. A metal-to-metal interface, on the other hand, provides structural advantages, including resistance to high levels of shock and vibration. However, a metal-to-metal interface suffers the abovementioned shortcomings, in particular, in a metal-to-metal interface between a conduction frame of a circuit and a card cage, the temperature of the surface of the conduction frame can be substantially higher than the temperature of the surface of the card cage, for example, as shown in FIG. 2B. An interface that includes a TIM offers enhanced thermal properties; however, since TIMs are elastic, the physical benefits of a metal-to-metal interface can be hindered.

Accordingly, systems and methods in accordance with embodiments described herein are provided that optimize heat conduction between electronic components on a circuit card and an enclosure, such as a card cage, into which the circuit card can be repeatedly inserted and positioned.

To achieve this, certain systems and methods in accordance with embodiments comprise an enclosure such as a card cage, chassis, rack, package or case that includes at least one high performance thermal interface material (TIM) positioned in a controlled-volume cavity, slot, crevice, groove, and the like, which, in some embodiments, can be formed in a sidewall of the enclosure and in other embodiments can be formed in an edge of a CCA module. In other embodiments, a TIM can be positioned in a controlled-volume cavity formed in a conduction plate or heat sink, or formed in other elements that provide a thermal interface when directly abutting the enclosure, such as a wedge clamp. This feature is particularly beneficial in applications where low thermal resistance is important, such as a wedge clamp interface between a CCA module and a card cage surface, which provides a significant thermal resistance improvement over a conventional dry-contact interface between two thermally conductive surfaces, i.e., between a CCA edge and a card cage surface.

Figure 3A:
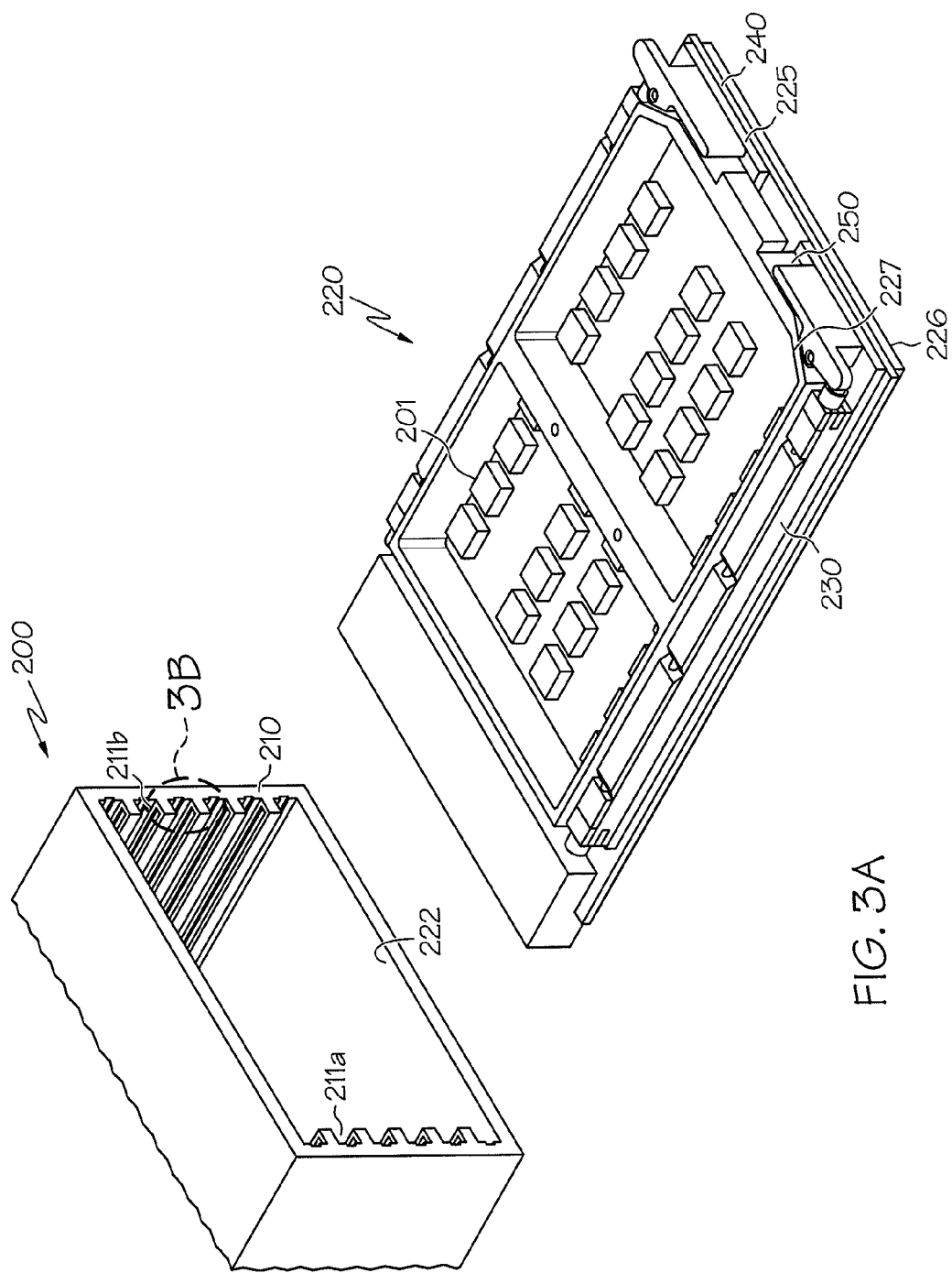
FIG. 3A is a perspective view of an embodiment of a conduction-cooled card cage in accordance with aspects of the present invention.

FIG. 3A is a perspective view of an embodiment of a conduction-cooled card cage 200 in accordance with aspects of the present invention. FIG. 3B is a perspective view of a card guide 211 of the card cage 200 of FIG. 3A including a slot-shaped cavity 214a formed in the card guide 211, in accordance with aspects of the present invention.

In an embodiment, the card cage 200 can comply with form factors and standards known to those of ordinary skill in the art, for example, ATR form factors and the like, or commercial off-the-shelf (COTS) or other custom form factors or standards. In an embodiment, the card cage 200 is a low pressure drop (HPLP) liquid cooled card cage, such as that described in U.S. Pat. No. 7,450,384, incorporated herein by reference in its entirety. In an embodiment, a plurality of card cages 200 can be configured together and positioned inside an enclosure, for example, a rack. Although a conduction-cooled card cage 200 is described with reference to the embodiments herein, features described herein can apply to other enclosures into which a circuit card can be mounted, for example, a computer system chassis, rack, or other enclosure that can receive one or more circuit cards.

The conduction-cooled card cage 200 comprising a card cage chassis 210 having at least one card guide 211. In one embodiment, the card guide 211 is part of a wall of the card cage chassis 210. In another embodiment, the card guide 211 is formed separately from the card cage chassis 210 and is thermally coupled to the wall of the chassis 210. Preferably, two card guides 211 are positioned to be parallel with, and aligned with, each other, at opposite sides of the card cage 200, for example, card guides 211a, 211b shown in FIG. 3A. In this manner, a circuit card, when inserted into the insertion end 222 at a front section of the card cage 200, can be secured in first and second card guides 211a, 211b at left and right sidewalls, respectively, of the card cage chassis 210. However, in other embodiments, card guides can be positioned at top and bottom surfaces, respectively, of the card cage 200.

Each card guide 211 in this example embodiment comprises a bottom surface 212, a top surface 213, and a sidewall surface 216, which form a card guide channel into which an edge of a circuit card can be inserted. In certain embodiments, the sidewall 216 of the card guide 211 can further include a card slot 217, also referred to as a substrate groove, which can register with a substrate 240 of a circuit card, for example, an edge of substrate 240 as shown in FIGS. 3B and 4B.

The card guide channel ensures proper alignment and registration of the circuit card with a backplane or motherboard (not shown) at a rear end of the card cage 200 opposite an insertion end 222 so that proper electrical connection between the circuit card and the backplane or motherboard can be achieved.

Figure 3C:
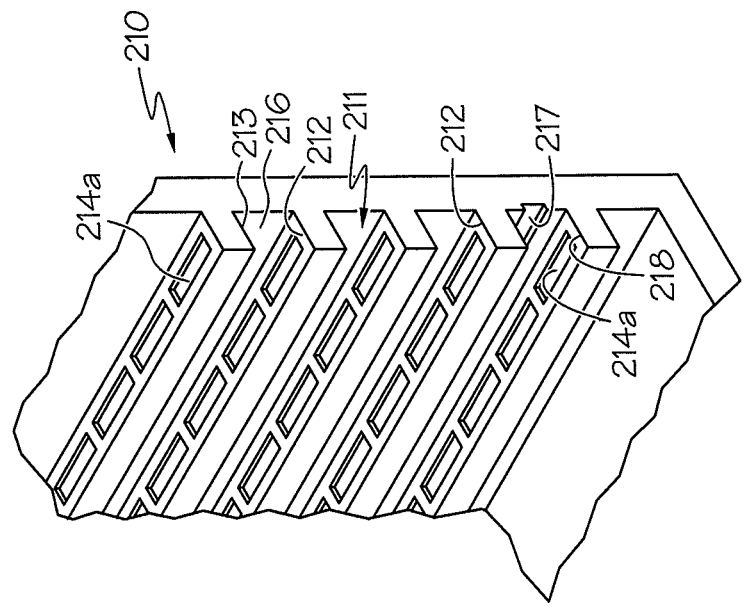
FIG. 3C is a perspective view of a card guide of a card cage including a plurality of cavities formed in the card guide, in accordance with aspects of the present invention.
Figure 3B:
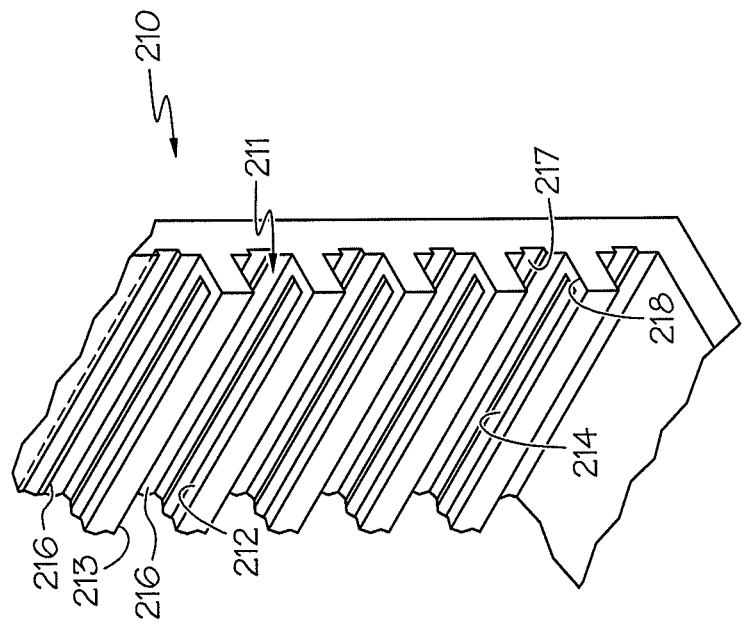
FIG. 3B is a perspective view of a card guide of the card cage of FIG. 3A including a slot-shaped cavity formed in the card guide, in accordance with aspects of the present invention.
Figure 4C:
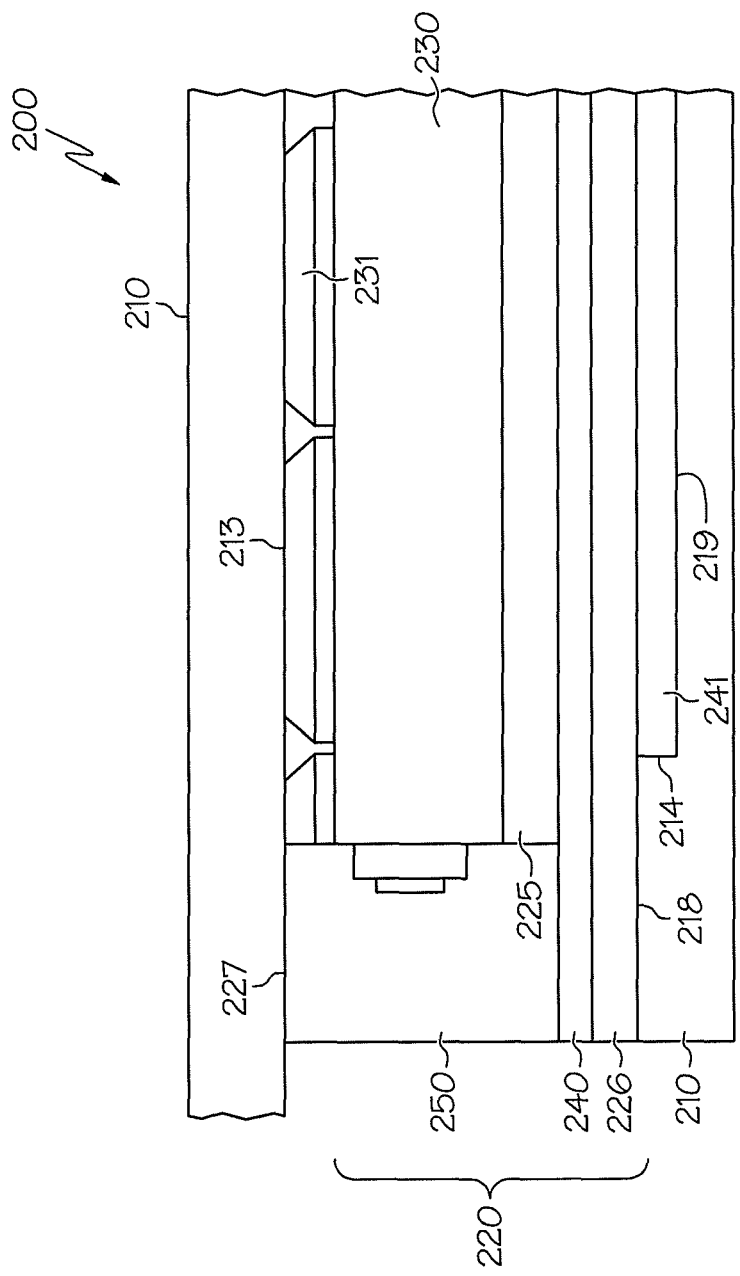
FIG. 4C is a cross-sectional side view of the circuit card and card cage of FIG. 4B.

In the embodiments shown in FIGS. 3B and 3C, the bottom surface 212 of the card guide 211 includes a controlled-volume cavity 214. The controlled-volume cavity 214 is configured to receive an appropriately-sized thermal interface material (TIM), for example, as shown in FIGS. 4A-4C. The cavity 214 is dimensioned to provide precise control over the compression of the TIM when a circuit card assembly 220 is inserted into the card guide 211 and compresses the TIM against the walls of the controlled-volume cavity 214.

In the embodiment of FIG. 3B, the controlled-volume cavity 214 is configured to extend along a majority of the length of the card guide 211, from the insertion end 222 of the card cage 200 to the rear section of the card cage 200, as a single cavity 214, on one or both of the top and bottom surfaces 213, 212 of the card guide 211. In other embodiments, as shown in FIG. 3C, a plurality of discrete controlled-volume cavities 214a can be positioned at one or both of the top and bottom surfaces 213, 212 of the card guide 211 to extend from the insertion end 222 of the card cage 200 to the rear section of the card cage 200. In the embodiment shown in FIG. 3C, the plurality of controlled-volume cavities 214a can each be aligned with each other along the length of the card guide 211. In other embodiments, the controlled-volume cavities 214a can be offset from one another relative along the length of the card guide 211.

Figures 5A, 5B:
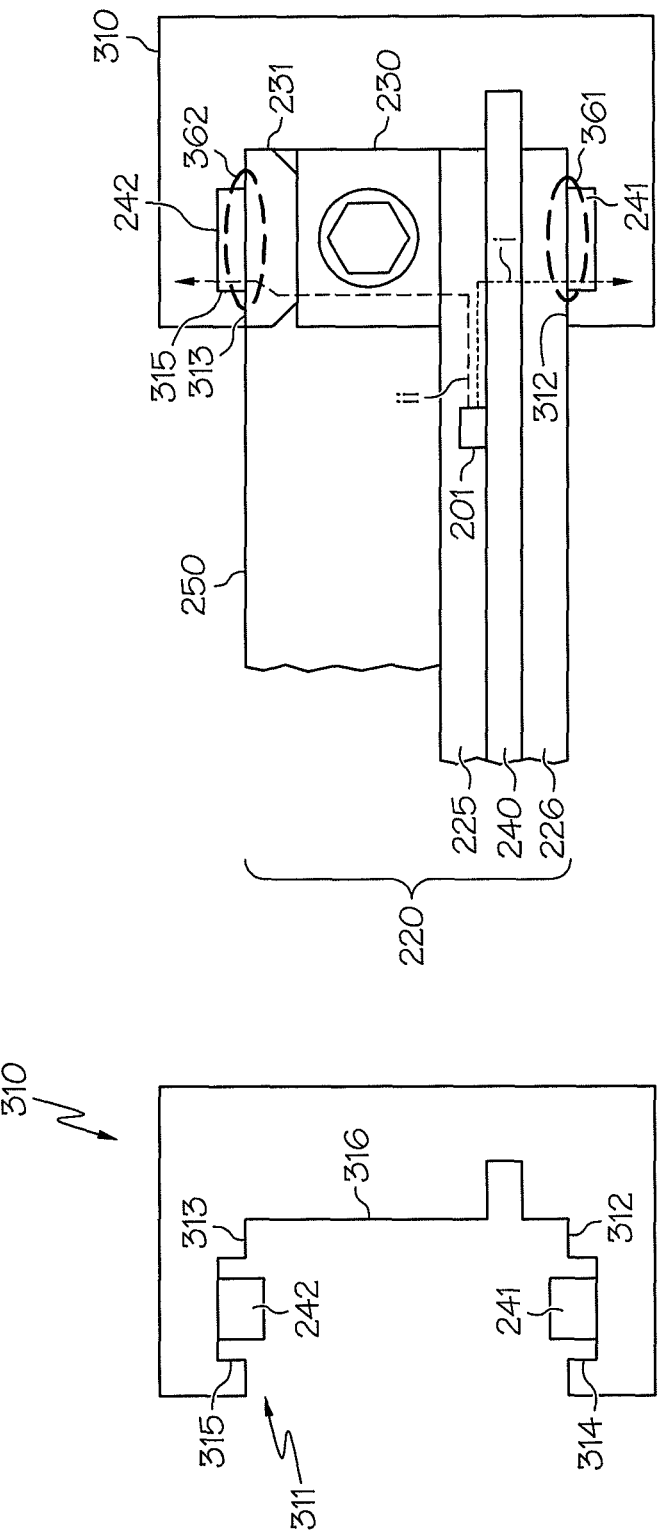
FIG. 5A is a cross-sectional front view of an embodiment of first and second thermal interface materials (TIMs) inserted first and second controlled-volume cavities, respectively, of a conduction-cooled card cage, in accordance with aspects of the present invention.
FIG. 5B is a cross-sectional front view of the conduction-cooled card cage shown in FIG. 5A populated with a circuit card secured to the conduction-cooled card cage by a wedge clamp, in accordance with aspects of the present invention.

Referring to FIG. 5A (described in detail below), in certain embodiments, a plurality of cavities 315 can be positioned in a top surface of a card guide, for example, top surface 313 of card guide 311, wherein each cavity 315 and corresponding TIM 242 can be aligned with a segment of the top portion 231 of a wedge clamp 230, such that the TIMs 242 are arranged to be in contact with the top portions 231 of the wedge clamp 230. In this embodiment, single or multiple controlled-volume cavities 314 and corresponding TIMs 241 can also be positioned in the lower surface 312 of the card guide 311.

FIG. 4A is a cross-sectional front view of one portion of the card guide 211 of FIGS. 3A and 3B, including a thermal interface material (TIM) 241 inserted into the controlled-volume cavity 214 of the conduction-cooled card cage 200 in accordance with aspects of the present invention. FIG. 4B is an expanded cross-sectional front view of the conduction-cooled card cage 200 shown in FIGS. 3A, 3B, and 4A populated with a circuit card assembly 220 secured to the conduction-cooled card cage 200 by the wedge clamp 230 in accordance with aspects of the present invention. FIG. 4C is a cross-sectional side view of the circuit card assembly 220 and card cage 200 of FIG. 4B.

As shown in FIGS. 4A-4C, a thermal interface material (TIM) 241 is positioned in the controlled-volume cavity 214, and is at least partially surrounded by walls of the first controlled-volume cavity 214.

In an embodiment, the TIM 241 is an elastomer-based TIM. In another embodiment, the TIM 241 is a wax-based TIM. In another embodiment, the TIM 241 is a polymeric TIM. In another embodiment, the TIM 241 comprises nanotube materials. In another embodiment, the TIM 241 comprises phase-change materials. In other embodiments, the TIM 241 comprises one or more conductive materials, such as metals, for example, malleable metals. In other embodiments, the TIM 241 comprises materials that permit a low thermal resistance interface path to be formed between electronic components 201 on the circuit card assembly 220 and the card cage chassis 210, thereby enhancing heat transfer between the circuit card assembly 220 and the chassis 210.

In an embodiment, prior to insertion of the circuit card assembly 220, the TIM 241 can be in an uncompressed state, wherein a first portion of the TIM 241 is positioned in the controlled-volume cavity 214 and a second portion of the TIM 241 protrudes from the controlled-volume cavity 214 and has a top surface that is higher than the bottom surface 212 of the card guide 211. When the circuit card assembly 220 is inserted into the card cage 200, the TIM 241 is in a compressed state, wherein the top surface of the TIM 241 directly abuts the surface of the circuit card assembly 220 and is substantially coplanar with the bottom surface 212 of the card guide 211.

As described above, the controlled-volume cavity 214 provides precise control over the amount of compression the TIM 241 is subjected to when the circuit card assembly 220 is inserted into the card cage 200. To achieve this, the bottom surface 212 of the card guide 211 into which the controlled-volume cavity 214 is formed includes a hard compression stop 218, which determines the fixed spacing, or height, between the bottom surface of the card assembly 220 and the bottom surface 219 of the controlled-volume cavity 214. Thus, the hard compression stop 218 can control the amount of compression of the TIM 241 in the cavity 214 when the circuit card assembly 220 abuts the bottom surface 212 of the card guide 211 so as to prevent damage to the TIM during compression of the TIM, and to prevent the TIM from producing foreign object debris that may otherwise escape from the controlled-volume cavity 214, which may damage the contents of the card cage 200.

Specifically, the dimensions of the cavity 214, i.e., height, length, and width of the cavity 214, determine the corresponding volume of the TIM 241 to be inserted in the cavity. The amount of compression of the TIM 241 in the cavity 214 can therefore depend on the volume of the TIM 241 in the cavity 214. For example, in an uncompressed state, the TIM 241 may occupy a certain, first volume, and may protrude from the cavity 214, such that a top surface of the TIM 241 is higher than the bottom surface 212 of the card guide 211 (see, for example, FIG. 4A). When a circuit card assembly 220 is inserted into the card guide 211, and secured in place, for example, using the wedge clamp 230, as shown in FIG. 4B, the height of the TIM 241 is reduced such that the top surface of the TIM 241 is at a same or similar level as the bottom surface 212 of the card guide 211. Here, the volume of the TIM 241 is sufficiently compressed to occupy a second volume that is about equal to a volume of the corresponding controlled-volume cavity 214. The compressed TIM 241 conforms to the sidewalls of the cavity 214, and between the bottom surface 219 of the cavity 214 and the top of the cavity on which is positioned the circuit card assembly 220. The dimensions of the TIM 241 are thus carefully selected such that the first volume of the TIM and the second volume of the TIM correspond with the volume of the controlled-volume cavity 214. In the event that the TIM 241 has an insufficient volume relative to the volume of the corresponding controlled-volume cavity 214, this can result in little or no compression of the TIM 241, and therefore a potentially inadequate thermal interface. In the event that the TIM 241 has an excessive volume relative to the volume of the corresponding controlled-volume cavity 214, this can result in migration of the TIM 241 beyond the dimensions of the cavity 214 into the interface between the compression stop 218 and the bottom surface of the circuit card assembly 220, possibly damaging the TIM 241, and introducing foreign debris into the card cage 200.

Another feature is that a significant force can be applied to the compression stop 218, for example, by the wedge clamp 230, without damaging the TIM, while providing adequate shock and vibration tolerances at a dry-contact interface proximal to the controlled-volume cavity 214 where the circuit card assembly 220 thermally directly abuts the card guide 211. In addition, this configuration permits the circuit card assembly 220 to be repeatedly removed from and insertion into the card cage 200, while eliminating shear plane problems that may otherwise occur during removal and replacement of the card assembly 220, such as debris from the TIM that may occur during removal of the card assembly 220, which can damage the TIM 241 or the card cage 200. Also, since the TIM 241 can be in the form of a paste or liquid, the insertion of the TIM 241 into the controlled-volume cavity 214 can prevent the TIM from leaking from the TIM interface. Also, positioning of the TIM 241 inside the controlled-volume cavity 214 permits the TIM 241 to be reusable, i.e., the card assembly 220 can be repeatedly inserted and removed, without the oozing or stickiness that would otherwise occur in conventional TIM applications.

Referring back to FIGS. 3A-4B, in an embodiment, the circuit card assembly 220 is a conduction-cooled circuit card assembly (CCA). In an embodiment, the circuit card assembly 220 is a CCA that conforms to international standards, for example, IEEE Std. 1101.2-1992, ANSI-VITA 30.1, and VITA 48.2. In an embodiment, the circuit card assembly 220 can be a conventional CCA, similar to those described above. In other embodiments, the circuit card assembly 220 can be a printed circuit board (PCB), printed wiring board (PWB), or other electronic card, module, or board known to those of ordinary skill in the art. In other embodiments, a bottom surface of circuit card assembly 220 can include a controlled-volume cavity into which can be positioned a TIM, similar to TIM 241 described herein.

The circuit card assembly 220 can include a plurality of electronic components 201, for example, semiconductor chips, which are mounted on a substrate 240 of the circuit card assembly 220. The electronic components 201 can generate thermal energy, which can be conducted from the components 201 to the chassis wall 210.

In an embodiment, the conduction-cooled circuit card assembly 220 can include a conduction frame 250 that is positioned about the periphery or edge of the circuit card assembly 220 and transfers heat away from the electronic components 201 of the circuit card assembly 220 by conducting the heat from the electronic components 201 to the surrounding chassis wall 210.

In an embodiment, the circuit card assembly 220 comprises a first conduction plate 226 that is coupled to a bottom surface of the substrate 240 of the circuit card assembly 220 and is in thermal communication with the conduction frame 250 by a plurality of thermally conductive contacts between the frame 250 and plate 226 formed through vias in the substrate 240. In an embodiment, a portion 225 of the conduction frame 250 is coupled to a top surface of the substrate 240 between the wedge clamp 230 and the substrate 240. In an embodiment, the portion 225 of the conduction frame 250 coupled to the top surface of the substrate 240 can be a second conduction plate. In an embodiment, a first conduction interface 261, also referred to as a first thermal interface, can be formed between the first conduction plate 226 and the bottom surface 212 of the card guide 211. A TIM 241 is positioned in a portion of the first conduction interface 261 between the first conduction plate 226 and the controlled-volume cavity 214 in the bottom surface 212 of the card guide 211 formed in the chassis wall 210. The wedge clamp 230, when expanded, applies an outward force, which operates in an outward direction from the floating, top portion 231 of the wedge clamp 230 into a top surface 213 of the card guide 211 and in an outward direction from the bottom surface of the plate 226 into a bottom surface 212 of the card guide 211. The outward force from the plate 226 is applied through the TIM 241, which becomes compressed into the controlled-volume cavity 214 by the first conduction plate 226. As a result, the first conduction plate 226 is in thermal contact with both the TIM 241 and the compression stop 218 at the bottom surface 212 of the card guide 211. Thus, the wedge clamp 230, when expanded, secures the circuit card assembly 220 firmly in place against the chassis wall 210, thereby providing high resistance to shock and vibration while providing high thermal contact between the card assembly 220 and the chassis wall 210. In addition, the TIM 241 positioned in the controlled-volume cavity 214 provides a significant improvement in the thermal resistance of the thermal interface between the circuit card assembly 220 and the chassis wall 210; on the order of a 2:1 to 4:1 improvement over conventional dry-contact interfaces.

In an embodiment, the conduction frame 250 has a top edge 227, wherein a second conduction interface 262 is formed between the top edge 227 of the conduction frame 250 and the top surface 213 of the card guide 211. A TIM can be positioned between the top edge 227 of the conduction frame 250 and the top surface 213 of the card guide 211 or a sidewall of the card cage 200. The TIM can be positioned in a controlled-volume cavity that, in an embodiment, is located in the top surface 213 of the card guide 211, for example, as shown in FIG. 5A. In another embodiment, the controlled-volume cavity and TIM can be positioned or formed in the top edge 227 of the conduction frame 250.

In general, a greater percentage of heat generated by electronic components on the circuit card assembly 220 is conductively removed from the circuit card assembly 220 via the first conduction interface 261 than via the second conduction interface 262 (see FIG. 4B). This is due to the thermal resistance properties of the first and second conduction interfaces 261, 262. The first conduction interface 261 has a lower thermal resistance than the second conduction interface 262, due in large part to the thermal properties of the wedge clamp 230 positioned between the heat-generating electronic components 201 and the second conduction interface 262.

Figure 5C:
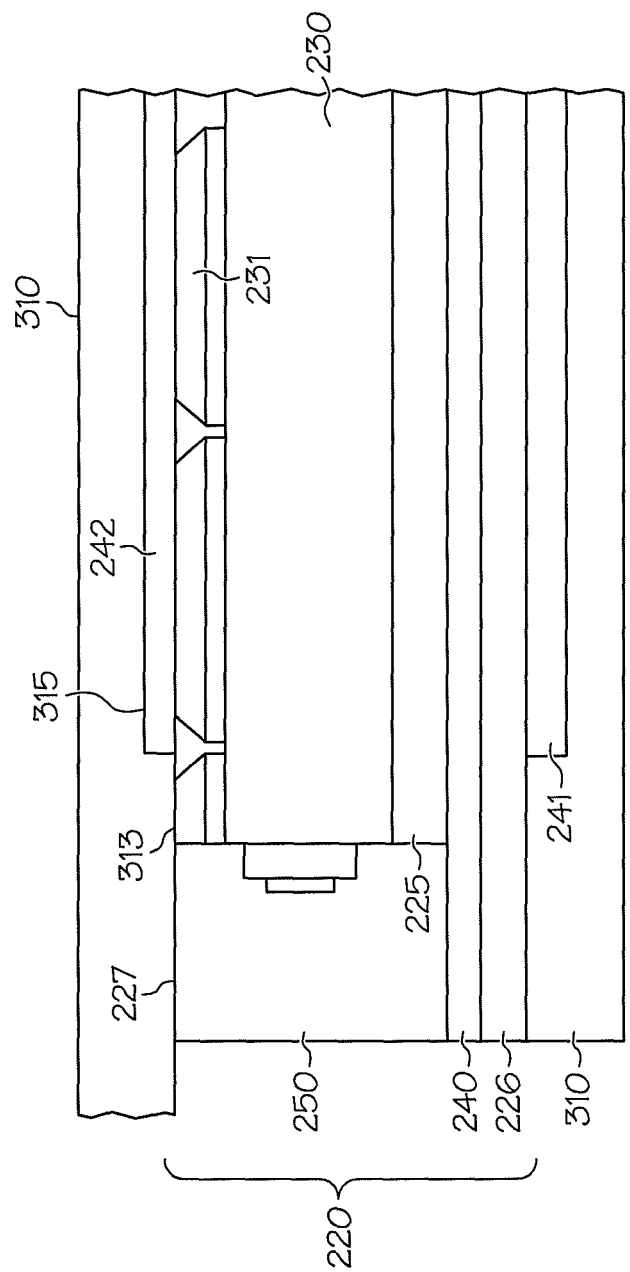
FIG. 5C is a cross-sectional side view of the circuit card and card cage of FIGS. 5A and 5B.

FIG. 5A is a cross-sectional front view of an embodiment that includes first and second thermal interface materials (TIMs) 241, 242 inserted into first and second controlled-volume cavities 314, 315, respectively, of a conduction-cooled card cage 310 in accordance with aspects of the present invention. FIG. 5B is a cross-sectional front view of the conduction-cooled card cage 310 shown in FIG. 5A populated with a circuit card assembly 220 secured to the conduction-cooled card cage 310 by a wedge clamp 230 in accordance with aspects of the present invention. FIG. 5C is a cross-sectional side view of the circuit card assembly 220 and card cage 310 of FIGS. 5A and 5B;

The embodiments of FIGS. 5A-5C are similar to those described in FIGS. 4A-4C, except that in the embodiments of FIGS. 5A-5C, a second controlled-volume cavity 315 is positioned in a top surface 313 of a card guide 311, and a second TIM 242 is inserted into the second controlled-volume cavity 315. In this manner, both first and second conduction interfaces 361, 362 are formed. A first conduction path (i) between electronic components 201 on a circuit card assembly 220 and the card cage 310 is formed through the first conduction interface 361 between conduction plate 226 and the bottom surface 312 of the card guide 311, and a second conduction path (ii) can be formed through the second TIM 242 at the second interface 362 between the top portion 231 of the wedge lock 230 and the top surface 313 of the card guide 311.

In this manner, the advantages of the second TIM 242 in the second controlled-volume cavity 315 are similar to those described above with regard to TIM 241, and improved efficiency of the second conduction path (ii) can also be achieved.

As described above, the embodiment of FIGS. 5A-5C includes a first TIM 241 and a second TIM 242 positioned in both corresponding first and second controlled-volume cavities 314, 315, respectively. In other embodiments, the second TIM 242 can comprise multiple TIMs, seated in multiple corresponding second controlled-volume cavities 315, in a manner similar to that described above in connection with FIG. 3C. In other embodiments, the first TIM 241 and corresponding first controlled-volume cavity 314 are optional.

FIG. 6 is a front view of an embodiment wherein a thermal interface material (TIM) 441 is inserted into a controlled-volume cavity 414 formed directly in an outer surface of a conduction plate 426, in accordance with aspects of the present invention. The conduction plate 426 is positioned at a bottom portion of a circuit card 420, for example, a CCA. In other embodiments, a second conduction plate 425, or a heat sink, can be positioned at a top portion of a circuit card 420. The relative dimensions of the controlled-volume cavity 414 and the TIM 441 can be selected to provide a suitable, reusable, thermal interface, as described above. The circuit card 420 can be inserted into the enclosure 410, which, in embodiments, can be a card cage or other enclosure known to those of ordinary skill in the art. In this manner, a conduction interface 461 can be formed between the conduction plate 426 and the enclosure 410, which can provide advantages similar to those of the embodiments described above with regard to FIGS. 3-5.

Figure 7:
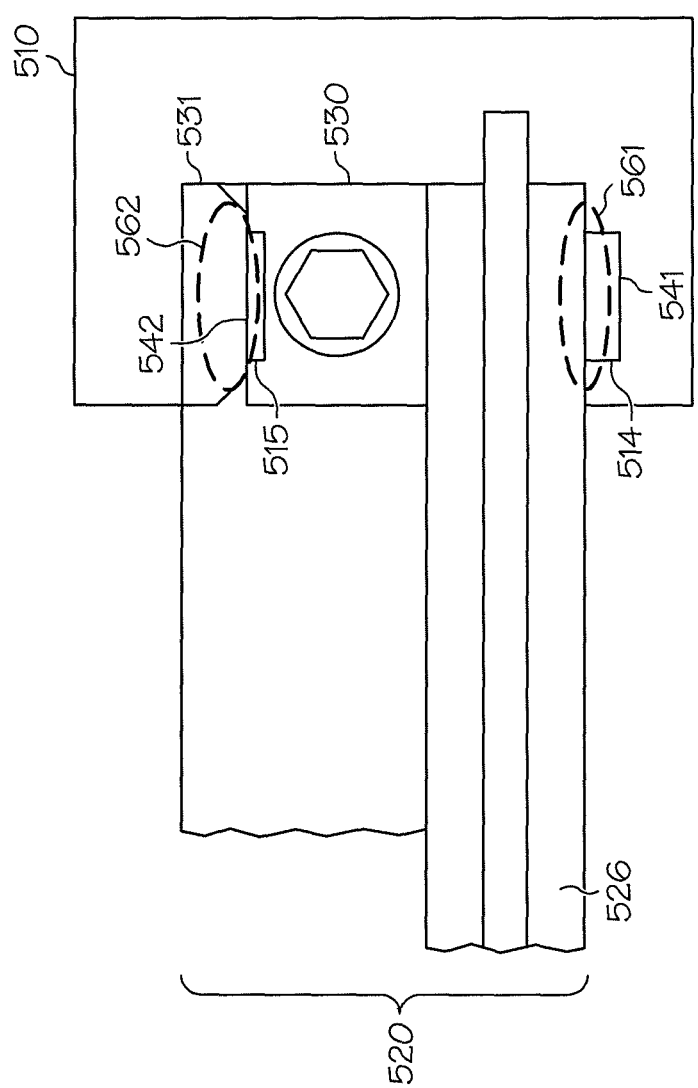
FIG. 7 is a front view of an embodiment wherein a thermal interface material (TIM) is inserted into a controlled-volume cavity formed directly in a wedge clamp, in accordance with aspects of the present invention.

FIG. 7 is a front view of an embodiment, wherein a thermal interface material (TIM) 542 is inserted into a controlled-volume cavity 515 formed directly in a top portion 531 of a wedge clamp 530 between the wedge clamp 530 and an enclosure 510. The relative dimensions of the controlled-volume cavity 514 and the TIM 541 can be selected to provide a suitable, reusable, thermal interface, as described above. The wedge clamp 530 can be part of a circuit card 520, which is inserted into the enclosure 510. In embodiments, the circuit card 520 can be a card cage or other enclosure known to those of ordinary skill in the art. In an embodiment, the circuit card 520 can be one that is known to those of ordinary skill in the art, such as a CCA. In this manner, a conduction interface 562 can be formed between the top portion of the wedge clamp 531 and the enclosure 510. In other embodiments, a TIM 541 can optionally be positioned in a controlled-volume cavity 514 in the enclosure 510, for example, in a card guide similar to card guides described above with regard to embodiments of FIGS. 3-5, or in a conduction plate 526 similar to the conduction plate 426 described above with regard to embodiments of FIG. 6, so that a conduction interface 561 can be formed, which can provide advantages similar to those of the embodiments described above.

Figure 8:
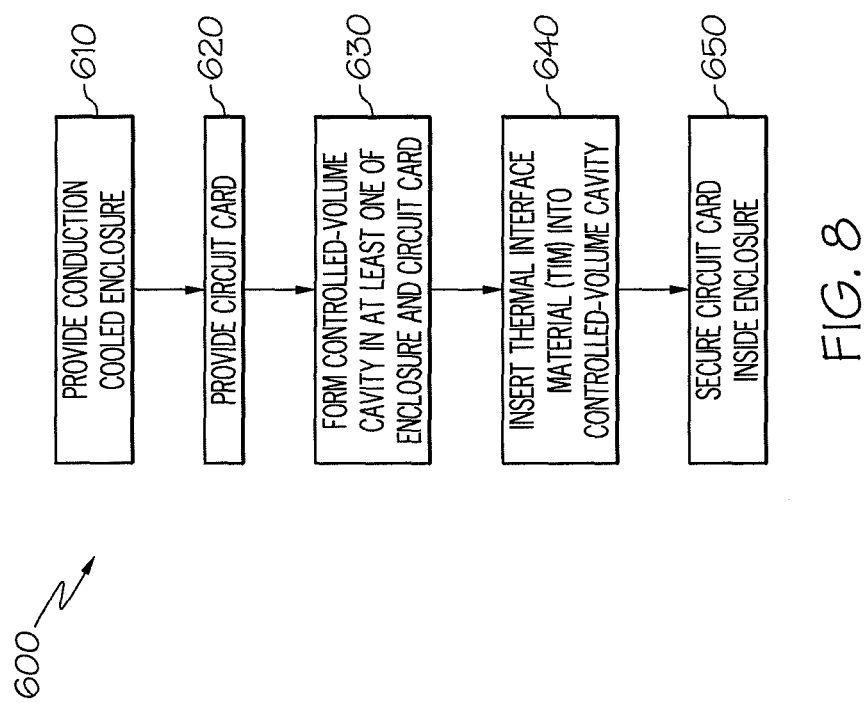
FIG. 8 is a flow diagram depicting an embodiment of a method of cooling a card cage in accordance with aspects of the present invention.

FIG. 8 is a flow diagram 600 depicting an embodiment of a method of cooling a card cage in accordance with aspects of the present invention. Step 610 includes a providing a conduction-cooled enclosure. Step 620 includes providing a circuit card. Step 630 includes forming a controlled-volume cavity in at least one of the enclosure and the circuit card. Step 640 includes inserting a thermal interface material (TIM) into the controlled-volume cavity. Step 650 includes securing the circuit card inside the enclosure. In this manner, at least one conduction path can be formed from the circuit card to the enclosure.

Thus, the advantages of a conduction-cooled apparatus configured in accordance with this disclosure over a conventional conduction-cooled apparatus can include the following: (1) substantial improvement in thermal resistance of a thermal interface between an edge of a circuit card and a chassis wall; (2) preservation of shock and vibration performance, regardless of the presence of a thermal interface material (TIM); (3) reduction in risk of foreign object debris being formed in the enclosure due to stresses on the TIM; (4) preservation of high cycle requirements, thereby permitting repeated insertion/removal cycles; and (5) removal and replacement of the circuit card with motion in the shear plane.

While the foregoing has described what are considered to be the best mode and/or other preferred embodiments, it is understood that various modifications can be made therein and that the invention or inventions may be implemented in various forms and embodiments, and that they may be applied in numerous applications, only some of which have been described herein. It is intended by the following claims to claim that which is literally described and all equivalents thereto, including all modifications and variations that fall within the scope of each claim.

What is claimed is:

1. A conduction-cooled enclosure comprising:
   a first card guide and a second card guide, each having a first wall surface, a second wall surface, a sidewall between the first and second wall surfaces, and a card guide channel in a region between the first wall surface and the second wall surface, wherein the sidewall of the first card guide faces the sidewall of the second card guide, wherein the first and second wall surfaces of the first card guide face each other, wherein the first and second wall surfaces of the second card guide face each other, and wherein the first card guide and the second card guide define a card slot of the enclosure;
   at least one controlled-volume cavity, the controlled-volume cavity comprising a recess in at least one of the first wall surface and the second wall surface of at least one of the first card guide and the second card guide, the recess having exclusively one opening such that the controlled-volume cavity is sealed other than at the one opening; and
   a compressible thermal interface material (TIM) in the recess of at least one controlled-volume cavity.

2. The enclosure of claim 1, wherein the card guide includes a compression stop that controls the amount of compression of the TIM in the cavity.

3. The enclosure of claim 1, wherein the controlled-volume cavity extends along a majority of a length of the card guide.

4. The enclosure of claim 1, wherein the controlled-volume cavity comprises a plurality of recesses in the at least one of the first wall surface and the second wall surface, and wherein the TIM comprises a plurality of TIMs, each positioned in one of the plurality of controlled-volume cavities.

5. The enclosure of claim 1, wherein when a circuit card assembly is removably secured to the card guide, a first conduction cooling path is formed from the circuit card assembly to the enclosure through the TIM.

6. The enclosure of claim 5, wherein a second conduction cooling path is formed from the circuit card assembly through a dry-contact interface between the card guide and the circuit card assembly.

7. The enclosure of claim 1, wherein a first controlled-volume cavity is positioned in the first wall surface of the card guide channel and a second controlled-volume cavity is positioned in the second wall surface of the card guide channel, and wherein a first TIM is positioned in the first controlled-volume cavity and a second TIM is positioned in the second controlled-volume cavity.

8. The enclosure of claim 7, wherein when a circuit card assembly is removably secured to the card guide, a first conduction cooling path is formed from the circuit card assembly to the enclosure through the first TIM and a second conduction cooling path is formed from the circuit card assembly to the enclosure through the second TIM.

9. The enclosure of claim 8, wherein a third conduction cooling path is formed from the circuit card assembly through a dry-contact interface between the first wall surface of the card guide and the circuit card assembly and a fourth conduction cooling path is formed from the circuit card assembly to the enclosure through a dry-contact interface between the second wall surface of the card guide and the circuit card assembly.

10. The enclosure of claim 1 further comprising a circuit card assembly positioned in the card guide channel, and in thermal contact with the at least one of the first wall surface and the second wall surface of the card guide, wherein the circuit card assembly comprises electronic components, and wherein the circuit card assembly is in thermal contact with the at least one of the first wall surface and the second wall surface of the card guide via a dry-contact interface between the circuit card assembly and the at least one of the first wall surface and the second wall surface of the card guide.

11. The enclosure of claim 10, wherein a conduction cooling path is provided from the electronic components of the circuit card assembly to the enclosure through the TIM and through the dry-contact interface.

12. The enclosure of claim 10, wherein the circuit card assembly is a conduction-cooled circuit card assembly (CCA).

13. The enclosure of claim 10, wherein the circuit card assembly comprises a conduction frame proximal to an edge of the circuit card assembly, the conduction frame in thermal communication with the electronic components.

14. The enclosure of claim 13, wherein the TIM is compressed in the at least one controlled-volume cavity between the conduction frame and the card guide, such that the conduction frame is in thermal contact with the card guide and the TIM.

15. The enclosure of claim 10, wherein the circuit card assembly comprises a retaining device that secures the circuit card assembly in place against the card guide.

16. The enclosure of claim 15, wherein the retaining device comprises a wedge clamp.

17. The enclosure of claim 15, wherein the retaining device applies a force against the circuit card assembly to compress the TIM in the controlled-volume cavity until the edge of the circuit card assembly is in thermal contact with the card guide and the TIM.

18. The enclosure of claim 17, wherein the TIM is compressed in the controlled-volume cavity between the circuit card assembly and the card guide, such that the circuit card assembly is in thermal contact with the at least one of the first and second wall surfaces of the card guide and the TIM.

19. The enclosure of claim 10, wherein the circuit card assembly includes a controlled-volume cavity.

20. The enclosure of claim 19, wherein a TIM is positioned in the controlled-volume cavity of the circuit card assembly.

21. The enclosure of claim 20, wherein a conduction cooling path is provided from the electronic components of the circuit card assembly to the enclosure through the TIM and the dry-contact interface.

22. A card guide of a conduction-cooled enclosure constructed and arranged to accept an edge of a circuit card, wherein a dry-contact interface is between the card guide and the circuit card, the card guide including:
 a top surface;
 a bottom surface;
 a sidewall between the top surface and the bottom surface, wherein the sidewall of the card guide faces a sidewall of another card guide of the enclosure, and wherein the top and bottom surfaces of the card guide face each other;
 a card guide channel in a region between the top surface and the bottom surface, the card guide channel facing a card guide channel of the other card guide;
 a controlled-volume cavity, the controlled-volume cavity comprising a recess in at least one of the top surface and the bottom surface of the card guide, the recess having exclusively one opening such that the controlled-volume cavity is sealed other than at the one opening; and
 a compressible thermal interface material (TIM) in the recess of the controlled-volume cavity, wherein when the circuit card is mounted in the card guide channel, the circuit card is in thermal contact with the at least one of the top surface and the bottom surface such that a conduction cooling path is formed from the circuit card to the enclosure through the TIM.

23. The card guide of claim 22, wherein the conduction cooling path is formed through the dry-contact interface.

24. The card guide of claim 22, wherein a first card guide is positioned at a first side of the enclosure and accepts a first edge of the circuit card, and wherein a second card guide is positioned at a second side of the enclosure opposite the first side and accepts a second edge of the circuit card opposite the first edge.

25. The card guide of claim 22, wherein the circuit card is a conduction-cooled circuit card assembly (CCA).

26. The card guide of claim 22, wherein the circuit card comprises a conduction frame proximal to the edge of the circuit card, and wherein the TIM is compressed in the controlled-volume cavity between the conduction frame and the card guide, such that the conduction frame is in thermal contact with the card guide and the TIM.

27. The card guide of claim 22, wherein the circuit card comprises a wedge clamp that secures the circuit card in place against the card guide.

28. The card guide of claim 27, wherein the wedge clamp applies a force against the circuit card to compress the TIM in the controlled-volume cavity until the edge of the circuit card is in thermal contact with the card guide and the TIM.

29. The card guide of claim 28, wherein the TIM is compressed in the controlled-volume cavity between the circuit card and the card guide, such that the circuit card is in thermal contact with the at least one of the top and bottom surfaces of the card guide and the TIM.

30. The card guide of claim 22, wherein the card guide includes a compression stop that controls the amount of compression of the TIM in the cavity.

31. The card guide of claim 22, wherein the controlled-volume cavity comprises a plurality of cavities in at least one of the top surface of the card guide and the bottom surface of the card guide, and wherein the TIM comprises a plurality of TIMs, each positioned in one of the plurality of cavities.

32. The card guide of claim 22, wherein a first controlled-volume cavity is positioned in the bottom surface of the card guide and a second controlled-volume cavity is positioned in the top surface of the card guide, and wherein a first TIM is in the first controlled-volume cavity and a second TIM is in the second controlled-volume cavity.

33. The card guide of claim 22, wherein when the circuit card is mounted in the card guide channel, a first conduction cooling path is formed from the circuit card to the enclosure through the first TIM and a second conduction cooling path is formed from the circuit card to the enclosure through the second TIM.

34. The card guide of claim 33, wherein a third conduction cooling path is formed from the circuit card through a dry-contact interface between the top surface of the card guide and the circuit card and a fourth conduction cooling path is formed from the circuit card to the enclosure through a dry-contact interface between the bottom surface of the card guide and the circuit card.

* * * * *